United States Patent [19]

Pelley, III et al.

[11] Patent Number: 5,315,179
[45] Date of Patent: May 24, 1994

[54] BICMOS LEVEL CONVERTER CIRCUIT

[75] Inventors: Perry H. Pelley, III; Hamed Ghassemi, both of Austin, Tex.

[73] Assignee: Motorola, Inc., Schaumburg, Ill.

[21] Appl. No.: 951,959

[22] Filed: Sep. 28, 1992

[51] Int. Cl.$^5$ .................. H03K 19/082; H03K 19/20
[52] U.S. Cl. .................................. 307/475; 307/446; 307/300
[58] Field of Search ............... 307/455, 446, 475, 570, 307/300

[56] References Cited

U.S. PATENT DOCUMENTS

| | | | |
|---|---|---|---|
| 4,806,799 | 2/1989 | Pelley, III et al. | 307/475 |
| 4,849,659 | 7/1989 | West | 307/475 |
| 4,864,159 | 9/1989 | Cornelissen | 307/264 |
| 4,988,898 | 1/1991 | Jansson | 307/475 |
| 4,992,681 | 2/1991 | Urakawa | 307/475 |
| 5,012,137 | 4/1991 | Muellner | 307/475 |
| 5,059,829 | 10/1991 | Flannagan et al. | 307/475 |
| 5,068,551 | 11/1991 | Bosnyak | 307/475 |
| 5,148,059 | 9/1992 | Chen | 307/475 |
| 5,148,061 | 9/1992 | Hsueh | 307/475 |
| 5,216,298 | 6/1993 | Ohba | 307/475 |

Primary Examiner—David R. Hudspeth
Assistant Examiner—Andrew Sanders
Attorney, Agent, or Firm—Daniel D. Hill

[57] ABSTRACT

A BICMOS level converter (60) for use at lower power supply voltages includes an input buffer (20) for receiving an ECL level input signal and providing level shifted buffered signals referenced to $V_{SS}$, a differential amplifier (61), a clamping circuit (71 and 72) for preventing the bipolar transistors (64 and 65) from operating in saturation, cross-coupled pull-up circuit (67) for a stronger transition from a logic low to a logic high, and a cross-coupled half-latch (75) for reducing the power consumption. The BICMOS level converter (60) has improved switching speeds, wider margins, and reduced power consumption for use at 3.3 volts.

14 Claims, 4 Drawing Sheets

BICMOS LEVEL CONVERTER CIRCUIT

CROSS-REFERENCE TO RELATED, COPENDING APPLICATION

A related, copending application is entitled "Power Supply Dependent Input Buffer", by Hamed Ghassemi et al., Ser. No. 7/951,153, assigned to the assignee hereof, and filed concurrently herewith.

FIELD OF THE INVENTION

This invention relates generally to logic level conversion, and more particularly, to a BICMOS level converter circuit.

BACKGROUND OF THE INVENTION

Integrated circuits are required to operate at increasingly lower power supply voltages and increasingly higher speeds. Integrated circuits are often used in applications where low power consumption and high speed are important, such as in a battery powered computer, or the like. An effective method for decreasing power consumption is to use a lower power supply voltage (for example, 3.3 volts).

There are several different logic families from which to choose when designing an integrated circuit. Among the different logic families are ECL and BINMOS. ECL (emitter-coupled logic) circuits employ bipolar transistors that operate in the active operating region and typically provide very high switching speeds, however, ECL circuits consume a large amount of power. The difference between an ECL logic high and an ECL logic low is only about one base-emitter diode voltage drop ($V_{BE}$). On the other hand, a BINMOS logic high is about one $V_{BE}$ below the positive power supply voltage, and a BINMOS logic low is approximately equal to the negative power supply voltage. BINMOS logic is usually implemented using BICMOS technology. A BICMOS circuit combines bipolar transistors with CMOS (complementary metal-oxide-semiconductor) transistors on the same integrated circuit. Generally, the bipolar transistors of a BICMOS circuit provide the advantage of high speed and high drive capability, while the CMOS transistors provide the advantage of reduced power consumption.

In order to achieve compatibility between the two different logic families, a level conversion circuit converts, or translates, a logic signal from ECL logic levels to BINMOS logic levels. A level conversion circuit should not cause excessive delay or consume a large amount of power. A conventional BICMOS level converter has a differential amplifier, emitter-follower input transistors for receiving an ECL level logic signal, and emitter-follower output transistors. The differential amplifier includes NPN transistors having their emitters coupled together, and a resistor coupled between each of the collectors and a positive power supply voltage terminal. N-channel MOSFET current sources are used to supply a relatively constant current.

The conventional BICMOS level converter, designed to operate with a power supply voltage of 5.0 volts, may not work reliability with a 3.3 volt power supply. When a 3.3 volt power supply is used instead of the 5.0 volt power supply, the operating margins of some of the transistors in the level converter circuit may be reduced. The margins are reduced in the conventional BICMOS level converter because a $V_{BE}$ voltage drop across a forward biased bipolar transistor is independent of the power supply voltage, and remains relatively constant. Therefore, when the power supply voltage is reduced, there may not be sufficient voltage range to allow for all of the $V_{BE}$ voltage drops without adversely affecting the operation of the circuit. Also, the integrated circuit may be more vulnerable to noise and to fluctuations in power supply voltages. In addition, the conventional BICMOS level converter may be considerably slower when operated at a lower power supply voltage, because the bipolar transistors of the ECL portion of the level converter may now be operating in the saturation operating region. If the bipolar transistors are allowed to operate in saturation, increased switching time, and an undesirable reduction in speed may result.

SUMMARY OF THE INVENTION

Accordingly, there is provided, in one form, a level converter for converting signals operating within a first predetermined voltage level range to a second predetermined voltage level range. The level converter includes a differential amplifier, a first emitter-follower circuit, a second emitter-follower circuit, and cross-coupled half-latch means. The differential amplifier is coupled to a first power supply voltage terminal, and includes first and second resistors and first and second bipolar transistors, and receives first and second input signals within the first predetermined voltage level range. In response, the differential amplifier provides first and second differential signals. The first emitter-follower circuit is coupled to the differential amplifier and receives the first differential signal. In response, the first emitter-follower circuit provides a third signal within the second predetermined voltage level range. The second emitter-follower circuit is coupled to the differential amplifier and receives the second differential signal. In response, the second emitter-follower circuit provides a fourth signal within the second predetermined voltage level range. The cross-coupled half-latch means is coupled to the first and second emitter-follower circuits, and reduces the fourth signal from a high voltage level to a low voltage level within the range of said second predetermined voltage level range in response to a high voltage level being provided by the second emitter-follower circuit. The cross-coupled half-latch also reduces the third signal from a high voltage level to a low voltage level within the range of the second predetermined voltage level range in response to a high voltage level being provided by the first emitter-follower circuit. These and other features and advantages will be more clearly understood from the following detailed description taken in conjunction with the accompanying drawings.

DESCRIPTION OF A PREFERRED EMBODIMENT

Figure 1:
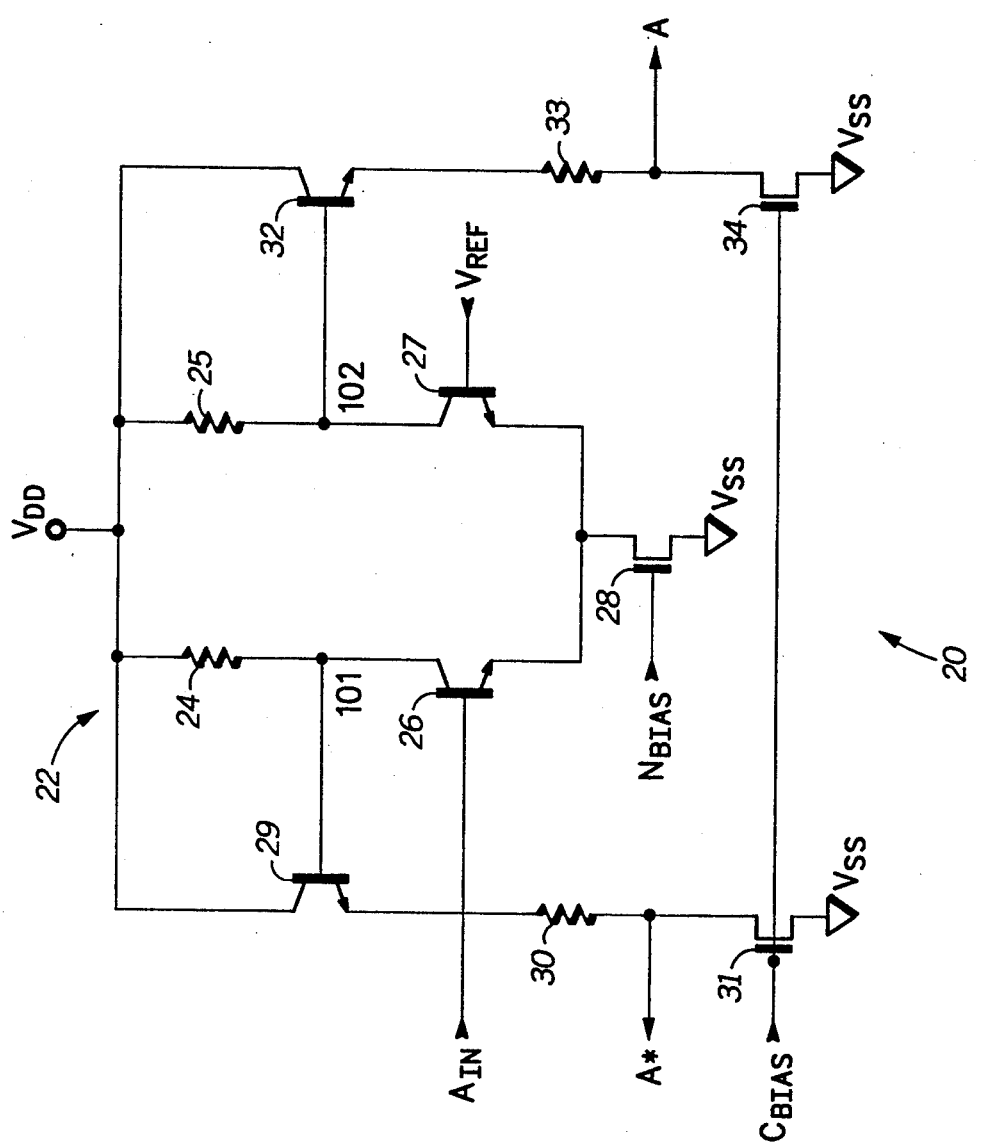
FIG. 1 illustrates in schematic diagram form an input buffer in accordance with the present invention.

FIG. 1 illustrates in schematic diagram form input buffer 20 in accordance with the present invention. Input buffer 20 includes differential amplifier 22, emitter-follower transistors 29 and 32, resistors 30 and 33, and N-channel transistors 31 and 34. Differential amplifier 22 includes resistors 24 and 25, NPN transistors 26 and 27, and N-channel transistor 28.

Resistor 24 of differential amplifier 22 has a first terminal connected to a positive power supply voltage terminal labeled "$V_{DD}$", and a second terminal connected to node 101. Resistor 25 has a first terminal connected to $V_{DD}$, and a second terminal connected to node 102. NPN transistor 26 has a collector connected to the second terminal of resistor 24 at node 101, a base for receiving an ECL level single-ended input signal labeled "$A_{IN}$", and an emitter. NPN transistor 27 has a collector connected to the second terminal of resistor 25 at node 102, a base for receiving a reference voltage labeled "$V_{REF}$", and emitter connected to the emitter of NPN transistor 26. N-channel transistor 28 has a drain connected to the emitters of NPN transistors 26 and 27, a gate for receiving a bias voltage labeled "$N_{BIAS}$", and a source connected to a negative power supply voltage terminal labeled "$V_{SS}$". Emitter-follower transistor 29 has a collector connected to $V_{DD}$, a base connected to the second terminal of resistor 24 at node 101, and an emitter. Resistor 30 has a first terminal connected to the emitter of emitter-follower transistor 29, and a second terminal for providing a buffered signal labeled "A*". N-channel transistor 31 has a drain connected to the second terminal of resistor 30, a gate for receiving a power supply dependent bias voltage labeled "$C_{BIAS}$", and a source connected to $V_{SS}$. Emitter-follower transistor 32 has a collector connected to $V_{DD}$, a base connected to the second terminal of resistor 25 at node 102, and an emitter. Resistor 33 has a first terminal connected to the emitter of emitter-follower transistor 32, and a second terminal for providing a buffered signal labeled "A". N-channel transistor 34 has a drain connected to the second terminal of resistor 33, a gate for receiving power supply dependent bias voltage $C_{BIAS}$, and a source connected to $V_{SS}$. Note that an asterisk (*) after the signal name indicates that the signal is active at a logic low.

In operation, single-ended ECL level input signal $A_{IN}$ is received by input buffer 20 at the base of NPN transistor 26. ECL level input signal $A_{IN}$ swings between an ECL logic level high of 1.6 volts and an ECL logic low of about 0.8 volts. N-channel transistor 28 receives bias voltage $N_{BIAS}$ and provides a current source for differential amplifier 22. $N_{BIAS}$ is provided at about 1.2 to 1.4 volts. Reference voltage $V_{REF}$ is provided to the base of NPN transistor 27 at a voltage level approximately at the midpoint of the logic swing of ECL level input signal $A_{IN}$. If input signal $A_{IN}$ is a logic low, it is more negative than reference voltage $V_{REF}$, NPN transistor 26 will be substantially non-conductive and NPN transistor 27 will be conductive. A current designated as "$I_{28}$", through N-channel transistor 28, will be steered through NPN transistor 27, and the voltage at node 102 will be equal to $V_{DD}$ minus $I_{28}R_{25}$ where $R_{25}$ is the resistance of resistor 25. The voltage at node 101 will be equal to approximately $V_{DD}$ since there is substantially no current flow through NPN transistor 26. If input signal $A_{IN}$ is equal to a logic high voltage, it is less negative than $V_{REF}$, causing NPN transistor 26 to be conductive and NPN transistor 27 to be substantially non-conductive. Current $I_{28}$ will be steered through NPN transistor 26 and the voltage at node 101 will be equal to $V_{DD}$ minus $I_{28}R_{24}$ where $R_{24}$ is the resistance of resistor 24, and the voltage at node 102 will be equal to approximately $V_{DD}$. Therefore, the difference between a logic high and a logic low voltage at nodes 101 and 102 of differential amplifier 22 is equal to the voltage drop across either of resistors 24 or 25. In the preferred embodiment, $R_{24}$ is equal to approximately $R_{25}$.

Emitter-follower transistors 29 and 32 receive the voltage at nodes 101 and 102, respectively. The emitter of emitter-follower transistor 29 provides a voltage equal to the voltage at node 101 less one base-emitter diode voltage drop ($V_{BE}$), where one $V_{BE}$ is equal to approximately 0.8 volts. The emitter of transistor 32 provides a voltage equal to the voltage at node 102 less one $V_{BE}$. Resistors 30 and 33 perform a level shift function by reducing the voltage provided by emitter-follower transistors 29 and 32. The amount of level shift, or voltage drop, provided by resistors 30 and 33 depends on the amount of current provided by N-channel transistors 31 and 34 and the resistance of resistors 30 and 33. Power supply dependent bias voltage $C_{BIAS}$ is provided to the gates of N-channel transistors 31 and 34, and determines the amount of current provided by N-channel transistors 31 and 34. N-channel transistors 31 and 34 function as power supply dependent current sources. Bias voltage $C_{BIAS}$ is variable, and dependent on power supply voltage $V_{DD}$. That is, as $V_{DD}$ changes, bias voltage $C_{BIAS}$ changes. If $V_{DD}$ is chosen to be 3.3 volts, $V_{DD}$ may fluctuate between 2.8 and 4.0 volts. An increase in $V_{DD}$ causes bias voltage $C_{BIAS}$ to increase, and a decrease in $V_{DD}$ causes bias voltage $C_{BIAS}$ to decrease. When $C_{BIAS}$ increases, the current provided by N-channel transistors 31 and 34 increases. Increased current flow increases the voltage drop across resistors 30 and 33. Likewise, a decrease in $V_{DD}$ reduces bias voltage $C_{BIAS}$, which decreases the voltage drop across resistors 30 and 33 because N-channel transistors 31 and 34 provide less current. Therefore, buffered signals A and A* remain constant with respect to $V_{SS}$ and independent of changes in $V_{DD}$.

Figure 2:
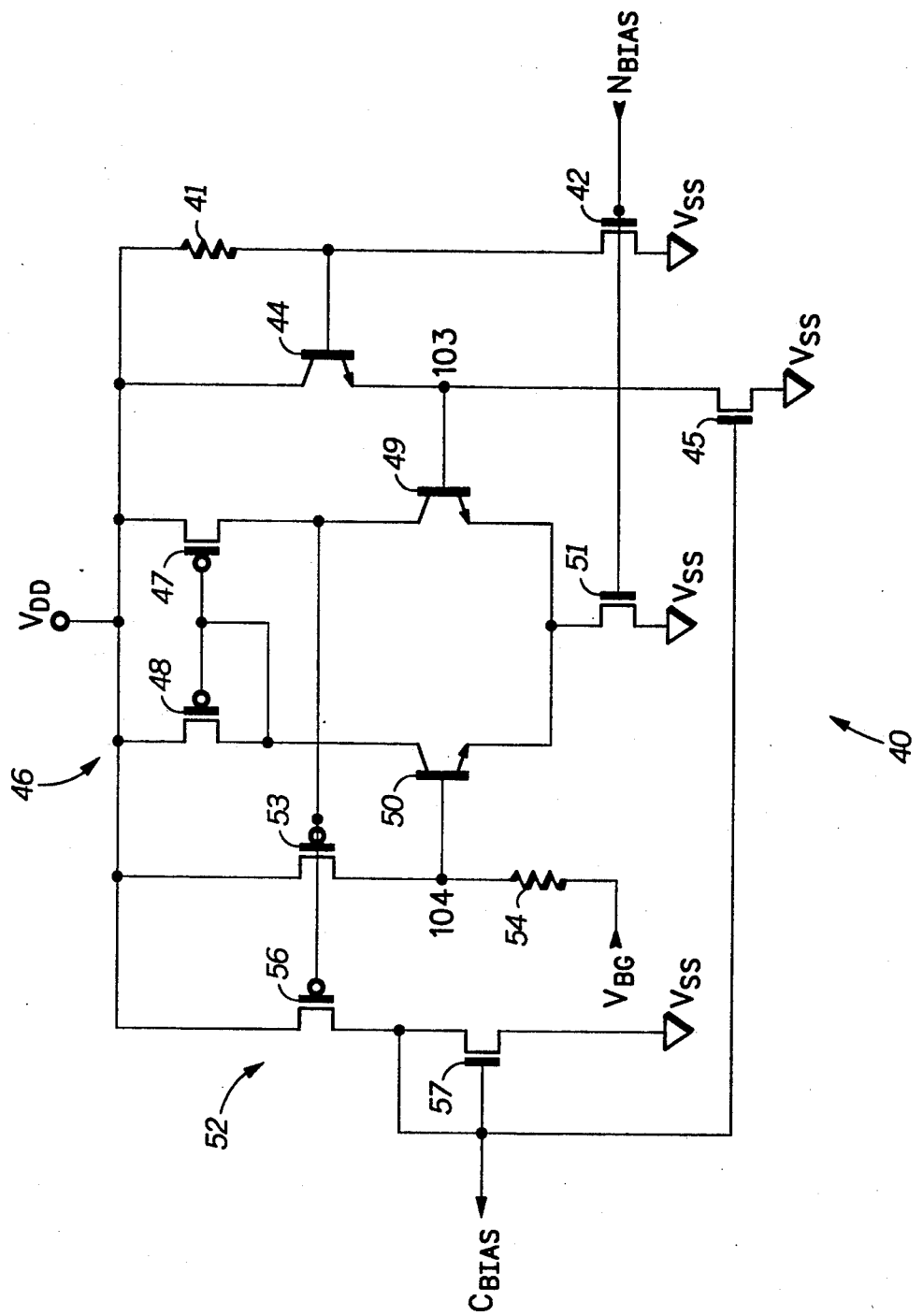
FIG. 2 illustrates in schematic diagram form a power supply dependent bias voltage generator circuit in accordance with the present invention.

As described above, bias voltage $C_{BIAS}$ is chosen so that the drain-source current provided by N-channel transistors 31 and 34 causes buffered signals A and A* to remain constant with respect to $V_{SS}$ and independent of power supply voltage $V_{DD}$. For example when $V_{DD}$ is equal to about 3.0 volts, the voltage drop across each of resistors 30 and 33 is equal to about 0.5 volts. If $V_{DD}$ increases to about 3.5 volts, the voltage drop across each of resistors 30 and 33 increases to about 1.0 volt. This causes buffered signals A and A* to always remain constant with respect to $V_{SS}$, thereby ensuring that buffered signals A and A* have fixed margins independent of changes in $V_{DD}$. The circuit that provides $C_{BIAS}$ is illustrated in FIG. 2 and will be discussed later. Providing buffered signals A and A* with respect to $V_{SS}$ allows ample margins on the following stages, even at low power supply voltages.

In the preferred embodiment, buffered signals A and A* swing between a intermediate logic high voltage of 1.6 volts and a logic low voltage of 1.0 volt, and $V_{SS}$ is chosen to be ground. In the preferred embodiment, buffered signals A and A* are provided to level converter 60 of FIG. 3. Since buffered signals A and A* are referenced to $V_{SS}$, better margins and increased signal swings in level converter 60 are realized.

FIG. 2 illustrates in schematic diagram form, power supply dependent bias voltage generator circuit 40 in accordance with the present invention. Power supply dependent bias voltage circuit 40 includes resistors 41 and 54, NPN transistor 44, operational amplifier 46, N-channel transistors 42, 45, and 57, and current mirror 52. Operational amplifier 46 includes P-channel transistors 47 and 48, NPN transistors 49 and 50, and N-channel transistor 51. P-channel transistors 47 and 48 function as loads for operational amplifier 46. Current mirror 52 includes P-channel transistors 53 and 56.

Resistor 41 has a first terminal connected to $V_{DD}$, and a second terminal. N-channel transistor 42 has a drain connected to the second terminal of resistor 41, a gate for receiving $N_{BIAS}$, and a source connected to $V_{SS}$. NPN transistor 44 has a collector connected to $V_{DD}$, a base connected to the second terminal of resistor 41, and an emitter connected to node 103. N-channel transistor 45 has a drain connected to the emitter of NPN transistor 44 at node 103, a gate for receiving power supply dependent bias voltage $C_{BIAS}$, and a source connected to $V_{SS}$.

P-channel transistor 47 of operational amplifier 46 has a source connected to $V_{DD}$, a gate, and a drain. P-channel transistor 48 has a source connected to $V_{DD}$, and a gate and a drain connected to the gate of P-channel transistor 47. NPN transistor 49 has a collector connected to the drain of P-channel transistor 47, a base connected to the emitter of NPN transistor 44 at node 103, and an emitter. NPN transistor 50 has a collector connected to the drain of P-channel transistor 48, a base connected to node 104, and an emitter connected to the emitter of NPN transistor 49. N-channel transistor 51 has a drain connected to the emitters of NPN transistors 49 and 50, a gate for receiving bias voltage $N_{BIAS}$, and a source connected to $V_{SS}$.

P-channel transistor 53 of current mirror 52 has a source connected to $V_{DD}$, a gate connected to the drain of P-channel transistor 47, and a drain connected to the base of NPN transistor 50 at node 104. P-channel transistor 56 has a source connected to $V_{DD}$, a gate connected to the gate of P-channel transistor 53, and a drain for providing power supply dependent bias voltage $C_{BIAS}$. Resistor 54 has a first terminal connected to the base of transistor 50 at node 104, and a second terminal for receiving a band gap voltage labeled "$V_{BG}$". N-channel transistor 57 has a gate and a drain connected to the drain of P-channel transistor 56, and a source connected to $V_{SS}$.

In operation, N-channel transistor 42 and bias voltage $N_{BIAS}$ provide a relatively constant current source for resistor 41, making the voltage drop across resistor 41 relatively constant with respect to $V_{DD}$. NPN transistor 44 provides a voltage to the base of NPN transistor 49 at node 103 approximately equal to the voltage at the second terminal of resistor 41, less one $V_{BE}$. Since the voltage drop across resistor 41 is relatively constant with respect to $V_{DD}$, the voltage at node 103 is also relatively constant with respect to $V_{DD}$. P-channel transistors 47 and 48 form a current mirror, causing the collector current of NPN transistor 50 to follow the collector current of NPN transistor 49. Therefore, the voltage at node 104 follows the variations of the voltage at node 103 at approximately the same voltage. Bandgap voltage $V_{BG}$ is a conventional bandgap generated reference voltage and is provided to the second terminal of resistor 54. A bandgap generated reference voltage is substantially independent of changes in power supply voltage, temperature, and processing. Therefore, the voltage drop across resistor 54 varies proportionally to $V_{DD}$, causing the drain-source current through P-channel transistor 53 to vary as $V_{DD}$ varies. P-channel transistors 53 and 56 form current mirror 52. As the drain-source current through P-channel transistor 53 changes, the drain-source current through P-channel transistor 56 "mirrors" the change. The gate-to-source voltage of N-channel transistor 57 provides power supply dependent bias voltage $C_{BIAS}$. N-channel transistor 57 remains in saturation. Therefore, the drain-source current of N-channel transistor 57 changes as $V_{DD}$ changes. If $V_{DD}$ increases, power supply dependent bias voltage $C_{BIAS}$ increases, and if $V_{DD}$ decreases, bias voltage $C_{BIAS}$ decreases.

The characteristics of some integrated circuit devices change with respect to temperature. Power supply dependent bias voltage generator circuit 40 matches the temperature variations of input buffer 20. NPN transistor 44 of power supply dependent bias voltage circuit 40 tracks the $V_{BE}$ voltage shifts of NPN transistors 29 and 32 of input buffer 20, illustrated in FIG. 1. When the current provided to transistors 29 and 32 by N-channel transistors 31 and 34 changes with respect to $V_{DD}$ or temperature changes, the current provided to NPN transistor 44 by N-channel transistor 45 also changes, causing the $V_{BE}$ voltage drop across NPN transistor 29 or 32 to be the same as the voltage drop across NPN transistor 44. Also, current tracking is accomplished by providing bias voltage $C_{BIAS}$ to the gate of N-channel transistor 45. In addition, resistor 54 tracks the temperature variations of resistors 30 and 33 of input buffer 20 of FIG. 1.

Figure 3:
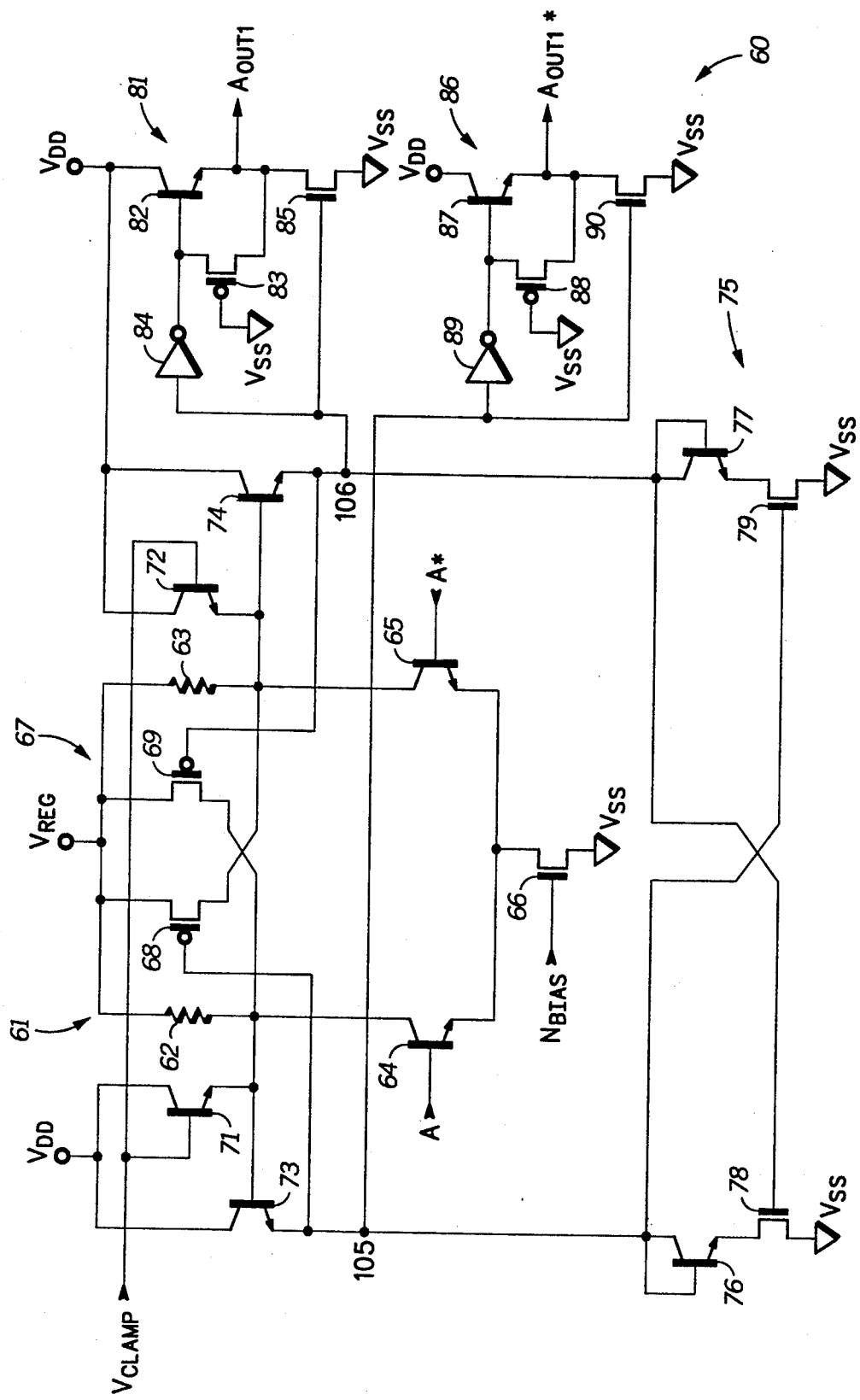
FIG. 3 illustrates in partial schematic diagram form and partial logic diagram form a level converter in accordance with one embodiment of the present invention.

FIG. 3 illustrates in partial schematic diagram form and partial logic diagram form level converter 60 in accordance with one embodiment of the present invention. Level converter 60 includes differential amplifier 61, cross-coupled pull-up circuit 67, NPN transistors 71, 72, 73, and 74, cross-coupled half-latch 75, and output driver portions 81 and 82. Differential amplifier 61 includes resistors 62 and 63, NPN transistors 64 and 65, and N-channel transistor 66. Cross-coupled half-latch 75 includes NPN transistors 76 and 77 and N-channel transistors 78 and 79.

Resistor 62 of differential amplifier 61 has a first terminal connected to a regulated power supply voltage terminal labeled "$V_{REG}$", and a second terminal. Resistor 63 has a first terminal connected to $V_{REG}$, and a second terminal. NPN transistor 64 has a collector connected to the second terminal of resistor 62, a base for receiving buffered signal A, and an emitter. NPN transistor 65 has a collector connected to the second terminal of resistor 63, a base for receiving buffered signal A*, and an emitter connected to the emitter of NPN transistor 64. N-channel transistor 66 has a drain connected to the emitters of transistors 64 and 65, a gate for receiving bias voltage $N_{BIAS}$, and a source connected to $V_{SS}$.

Cross-coupled pull-up circuit 67 includes P-channel transistors 68 and 69. P-channel transistor 68 has a source connected to $V_{REG}$, a gate connected to the emitter of NPN transistor 73 at node 105, and a drain connected to the second terminal of resistor 63. P-channel transistor 69 has a source connected to $V_{REG}$, a gate connected to the emitter of transistor 74 at node 106, and a drain connected to the second terminal of resistor 62.

NPN transistor 71 has a collector connected to $V_{DD}$, a base for receiving a bias voltage labeled "$V_{CLAMP}$", and an emitter connected to the second terminal of resistor 62. NPN transistor 72 has a collector connected to $V_{DD}$, a base for receiving bias voltage $V_{CLAMP}$, and an emitter connected to the second terminal of resistor 63. Emitter-follower transistor 73 is an NPN transistor and has a collector connected to $V_{DD}$, a base connected to the second terminal of resistor 62, and an emitter connected to node 105. Emitter-follower transistor 74 is also an NPN transistor and has a collector connected to $V_{DD}$, a base connected to the second terminal of resistor 63, and an emitter connected to node 106. NPN transistor 76 has a base and a collector connected to the emitter of emitter-follower transistor 73 at node 105, and an emitter. NPN transistor 77 has a base and a collector connected to the emitter of emitter-follower transistor 74 at node 106, and an emitter. NPN transistors 76 and 77 are diode-connected transistors and function as diodes. N-channel transistor 78 has a drain connected to the emitter of NPN transistor 76, a gate connected to the collector of NPN transistor 77, and a source connected to $V_{SS}$. N-channel transistor 79 has a drain connected to the emitter of NPN transistor 77, a gate connected to the collector of NPN transistor 76, and a source connected to $V_{SS}$.

Output driver portion 81 includes NPN transistor 82, P-channel transistor 83, N-channel transistor 85, and inverter 84. NPN transistor 82 has a collector connected to $V_{DD}$, a base, and an emitter for providing a BINMOS level output signal labeled "$A_{OUT1}$". Inverter 84 has an input terminal connected to the emitter of emitter-follower transistor 74 at node 106, and an output terminal connected to the base of NPN transistor 82. Inverter 84 is a conventional CMOS inverter. P-channel transistor 83 has a source connected to the base of transistor 82, a gate connected to $V_{SS}$, and a drain connected to the emitter of NPN transistor 82, N-channel transistor 85 has a drain connected to the emitter of NPN transistor 82, a gate connected to the input terminal of inverter 84 at node 106, and a source connected to $V_{SS}$.

Output driver portion 86 includes NPN transistor 87, P-channel transistor 88, N-channel transistor 90, and inverter 89. NPN transistor 87 has a collector connected to $V_{DD}$, a base, and an emitter for providing a BINMOS level output signal labeled "$A_{OUT1}*$". Inverter 89 has an input terminal connected to the emitter of emitter-follower transistor 73 at node 105, and an output terminal connected to the base of NPN transistor 87. Inverter 89 is also be a conventional CMOS inverter. P-channel transistor 88 has a source connected to the base of transistor 87, a gate connected to $V_{SS}$, and a drain connected to the emitter of NPN transistor 87, N-channel transistor 90 has a drain connected to the emitter of NPN transistor 87, a gate connected to the input terminal of inverter 89 at node 105, and a source connected to $V_{SS}$.

In operation, level converter 60 receives buffered signals A and A* from input buffer 20 of FIG. 1, and provides BINMOS level output signals $A_{OUT1}$ and $A_{OUT1}*$. Buffered signals A and A* are differential signals that swing between a logic high of 1.6 volts and a logic low of 1.0 volt, and are received by NPN transistors 64 and 65 of differential amplifier 61. If buffered signal A is an intermediate logic high and buffered signal A* is an intermediate logic low, then a current designated as $I_{66}$ through N-channel transistor 66 will be steered through NPN transistor 64 so that the voltage at the base of emitter-follower transistor 73 is reduced low enough to result in emitter-follower transistor 73 becoming substantially non-conductive. The voltage at the base of emitter-follower transistor 74 will be increased to a voltage high enough to cause emitter-follower transistor 74 to be conductive. Node 106 will be a logic high voltage equal to approximately $V_{REG}$ minus one $V_{BE}$.

When node 106 is a logic high voltage, and emitter-follower transistor 73 is substantially non-conductive, N-channel transistor 78 is conductive, thus reducing the voltage at node 105 to a logic low voltage. When node 105 is reduced to a logic low voltage of about 0.6 volts, diode-connected NPN transistor 76 becomes substantially non-conductive, causing N-channel transistor 78 to become substantially non-conductive. If N-channel transistor 78 was allowed to remain conductive, current would continue to flow unnecessarily, thus increasing power consumption. Since node 105 is low, the voltage at the gate of N-channel transistor 79 is low enough to cause N-channel transistor 79 to be substantially non-conductive. Also, a low voltage at node 105 causes P-channel transistor 68 of cross-coupled pull-up circuit 67 to become conductive, which helps to increase the voltage at the base of emitter-follower transistor 74 more rapidly.

If buffered signal A is an intermediate logic low and buffered signal A* is an intermediate logic high, then a current designated as $I_{66}$ through N-channel transistor 66 is steered through NPN transistor 65. The voltage at the base of emitter-follower transistor 74 is reduced low enough to result in emitter-follower transistor 74 becoming substantially non-conductive. The base of emitter-follower transistor 73 is increased to a voltage high enough to cause emitter-follower transistor 73 to become conductive, and node 105 will be equal to a logic high voltage of $V_{REG}$ minus one $V_{BE}$. When node 105 is a logic high voltage and emitter follower transistor 74 is non-conductive, N-channel transistor 79 is conductive, thus reducing the voltage at node 106 to a logic low. Since node 106 is low, N-channel transistor 78 is substantially non-conductive. When the voltage at node 106 reduced to a logic low, P-channel transistor 69 becomes conductive, which helps to pull-up the base of NPN transistor 73 more rapidly.

In other embodiments, the gates of P-channel transistors 68 and 69 may be connected to the second terminals of resistors 62 and 63, respectively. This provides a higher voltage to the gates of transistors 68 and 69, thus causing them to be less conductive and reducing the amount of base drive provided to emitter-follower transistors 73 and 74.

Resistors 62 and 63 are sized relatively large to prevent diode-connected NPN transistors 76 and 77 and N-channel transistors 85 and 90 (in output driver portions 81 and 86) from becoming conductive at high power supply voltages. As the power supply voltage increases, the voltage at nodes 105 and 106 increases. If a logic low voltage at node 105 or 106 increases above about 0.6 voltages, the base-emitter voltage of diode-connected NPN transistors 76 and 77 increases above 0.6 volts, and N-channel transistors 78 and 79 may become at least partially conductive when they should be substantially non-conductive. But, if resistors 62 and 63 are too large, the speed of level converter 60 may be adversely affected. Therefore, in the preferred embodiment, differential amplifier 61 and cross-coupled pull-up circuit 67 are provided with regulated power supply voltage $V_{REG}$. Regulating the power supply voltage allows the size of resistors 62 and 63 to be reduced. Resistors 62 and 63 are sized so that the voltage drop across each is equal to approximately 1.7 volts. Also, in the preferred embodiment, regulated power supply voltage $V_{REG}$ is supplied to provide 3.1 volts nominal with less than 50 millivolts of variation. Although a regulated power supply is used in the preferred embodiment, a non-regulated power supply voltage, such as $V_{DD}$, may be used in other embodiments if resistors 62 and 63 are sized appropriately.

A clamping circuit, comprising NPN transistors 71 and 72 and bias voltage $V_{CLAMP}$, prevents NPN transistors 64 and 65 from operating in the saturation region. Generally, a bipolar transistor operates in the saturation region when both the base-emitter and base-collector junctions are forward biased by more than approximately 0.7 volts. The base-collector junction of NPN transistors 64 and 65 may become forward biased as a result of several different conditions. For example, if buffered signals A and A* are allowed to increase to a high voltage level as a result of power supply fluctuations, NPN transistors 64 and 65 may operate in saturation. Also, if the drain-source current provided by N-channel transistor 66 is allowed to vary, the collector voltage of NPN transistors 64 or 65 will be reduced enough to cause NPN transistors 64 and 65 to operate in saturation. Bias voltage $V_{CLAMP}$ is provided to the bases of NPN transistors 71 and 72 at about 2.1 volts, preventing the collectors of NPN transistors 64 and 65 from going below about 1.3 volts. This causes NPN transistor 64 and 65 to stay in the active region of operation. Operating NPN transistors 64 and 65 in the active region provides the advantage of increased speeds. Also, in the preferred embodiment, buffered signals A and A* are provided by input buffer 20 (see FIG. 1), and referenced to $V_{SS}$ so that buffered signals A and A* are not affected by variations of $V_{DD}$.

Cross-coupled half-hatch 75 provides the advantage of reduced power consumption. N-channel transistors 78 and 79 are cross-coupled and made conductive only when necessary to reduce the voltage of nodes 105 or 106 to a logic low. Diode-connected NPN transistors 76 and 77 further reduce power consumption by preventing a leakage current from flowing and ensuring that N-channel transistors 78 and 79 remain non-conductive during a logic low state.

Output driver portions 81 and 86 are conventional BICMOS output drivers. Output driver portions 81 and 86 receive the voltages at nodes 106 and 105, respectively, and provide complementary BINMOS level output signals $A_{OUT1}$ and $A_{OUT1}$*. BINMOS level output signal $A_{OUT1}$ is inverted from the voltage level provided by node 106 and BINMOS level output signal $A_{OUT1}$* is inverted from the voltage level provided by node 105.

In output driver portion 81, NPN transistor 82 functions as a pull-up transistor, and N-channel transistor 85 functions as a pull-down transistor. When node 106 is a logic low, inverter 84 provides a logic high to the base of NPN transistor 82, making NPN transistor 82 conductive. N-channel transistor 85 is non-conductive, and output signal $A_{OUT1}$ is pulled to a logic high voltage approximately equal to $V_{DD}$ minus one $V_{BE}$ (approximately 2.5 volts). P-channel transistor 83 helps to prevent excessive reverse-biasing of the base-emitter junction of NPN transistor 82 when the voltage at the base of NPN transistor 82 is reduced to a logic low. Also, P-channel transistor 83 eventually increases the voltage of output signal $A_{OUT1}$ to $V_{DD}$, eliminating the $V_{BE}$ voltage drop across NPN transistor 82. When node 106 becomes a logic high, inverter 84 provides a logic low to the base of NPN transistor 82, causing NPN transistor 82 to be substantially non-conductive. N-channel transistor 85 becomes conductive, causing output signal $A_{OUT1}$ to be reduced to a logic low voltage approximately equal to $V_{SS}$. When the voltage at node 106 is a logic high, output signal $A_{OUT1}$ is provided as a logic low, and when node 106 is a logic low, output signal $A_{OUT1}$ is provided as a logic high. Output driver portion 86 is the same as output driver portion 81 and operates in the same manner. Note that output driver portions 81 and 86 are presented as an example of an BICMOS output driver circuit. There are various other BICMOS output drivers circuits that can be substituted for output driver portions 81 and 86.

Figure 4:
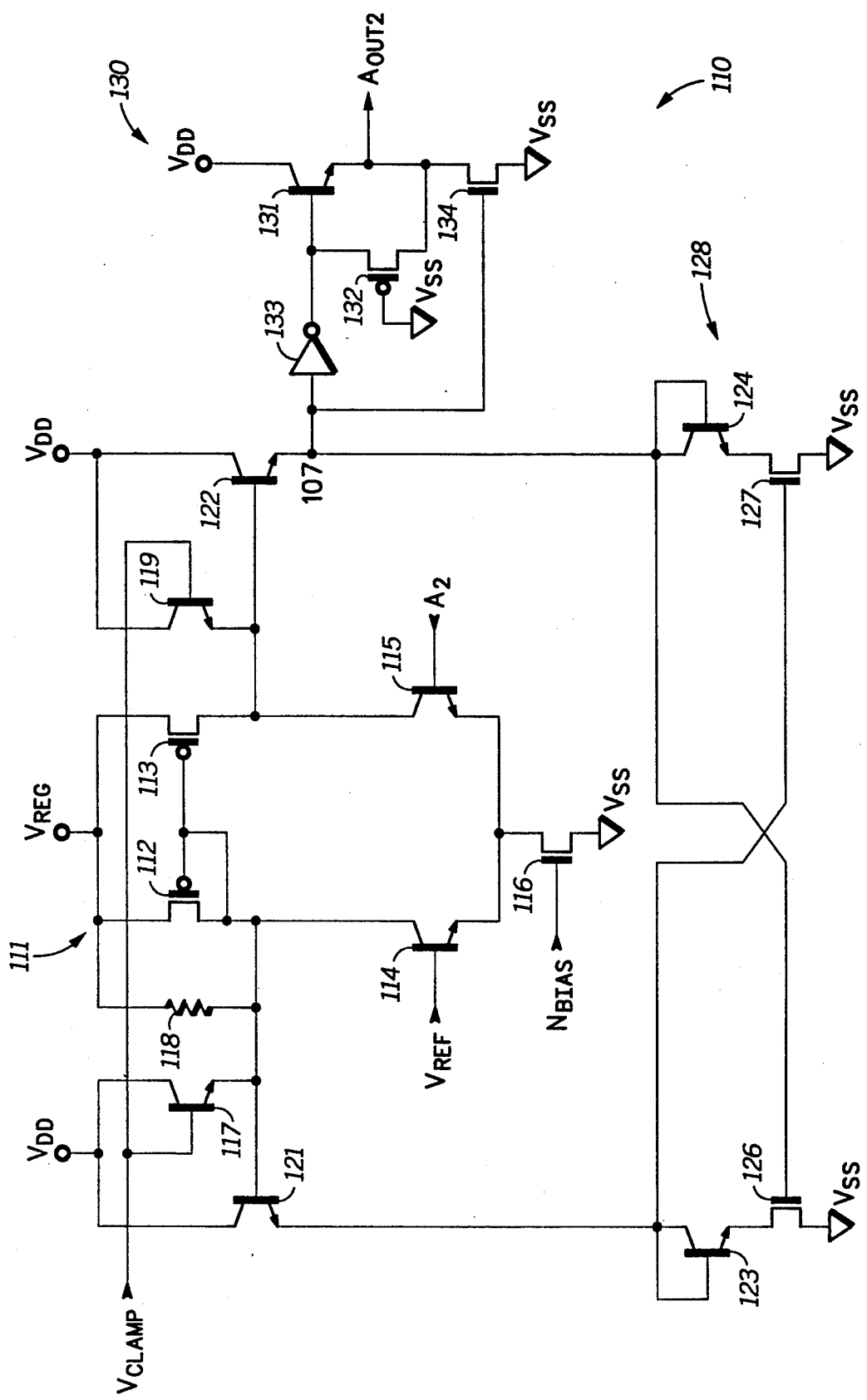
FIG. 4 illustrates in partial schematic diagram form and partial logic diagram form a level converter in accordance with another embodiment of the present invention.

FIG. 4 illustrates in partial schematic diagram form and partial logic diagram form level converter 110 in accordance with another embodiment of the present invention. Level converter 110 includes operational amplifier 111, cross-coupled half-latch 128, NPN transistors 117, 119, 121, and 122, resistor 118, and output driver portion 130.

Operational amplifier 111 includes P-channel transistors 112 and 113, NPN transistors 114 and 115, and N-channel transistor 116. P-channel transistor 112 has a source connected to $V_{REG}$, and a gate connected to its drain. P-channel transistor 113 has a source connected to $V_{REG}$, a gate connected to the gate of P-channel transistor 112, and a drain. NPN transistor 114 has a collector connected to the drain of P-channel transistor 112, a base for receiving reference voltage $V_{REF}$, and an emitter. NPN transistor 115 has a collector connected to the drain of P-channel transistor 113, a base for receiving single-ended signal $A_2$, and an emitter connected to the emitter of NPN transistor 114. N-channel transistor 116 has a drain connected to the emitters of NPN transistors 114 and 115, a gate for receiving bias voltage $N_{BIAS}$, and a source connected to $V_{SS}$. NPN transistor 117 has a collector connected to $V_{DD}$, a base for receiving bias voltage $V_{CLAMP}$, and an emitter connected to the collector of NPN transistor 114. Resistor 118 has a first terminal connected to $V_{REG}$, and a second terminal connected to the collector of NPN transistor 114. NPN transistor 119 has a collector connected to $V_{DD}$, a base connected to the base of NPN transistor 117 for receiving bias voltage $V_{CLAMP}$, and an emitter connected to the collector of NPN transistor 115. Emitter-follower transistor 121 has a collector connected to $V_{DD}$, a base connected to the collector of NPN transistor 114, and an emitter. Emitter-follower transistor 122 has a collector connected to $V_{DD}$, a base connected to the collector of NPN transistor 115, and an emitter.

Cross-coupled half-latch 128 includes NPN transistors 123 and 124, and N-channel transistors 126 and 127. NPN transistor 123 has a base and a collector connected to the emitter of emitter-follower transistor 121, and an emitter. NPN transistor 124 has a base and a collector connected to the emitter of emitter-follower transistor 122 at node 107, and an emitter. NPN transistors 123 and 124 are therefore diode-connected and perform the function of diodes. N-channel transistor 126 has a drain connected to the emitter of NPN transistor 123, a gate connected to the emitter of NPN transistor 122 at node 107, and a source connected to $V_{SS}$. N-channel transistor 127 has a drain connected to the emitter of NPN transistor 124, a gate connected to the emitter of NPN transistor 121, and a source connected $V_{SS}$.

Output portion 130 includes NPN transistor 131, P-channel transistor 132, N-channel transistor 134, and inverter 133. NPN transistor 131 has a collector connected to $V_{DD}$, a base, and an emitter for providing a BINMOS output signal labeled "$A_{OUT2}$". Inverter 133 has an input terminal connected to the emitter of emitter-follower transistor 122 at node 107, and an output terminal connected to the base of NPN transistor 131. P-channel transistor 132 has a source connected to the base of transistor 131, a gate connected to $V_{SS}$, and a drain connected to the emitter of NPN transistor 131, N-channel transistor 134 has a drain connected to the emitter of NPN transistor 131, a gate connected to the input terminal of inverter 133 at node 107, and a source connected to $V_{SS}$.

In operation, level converter 110 receives buffered single-ended signal $A_2$, reference voltage $V_{REF}$, and provides single-ended BINMOS level output signal $A_{OUT2}$. Reference voltage $V_{REF}$ is provided to the base of NPN transistor 114 at a level approximately at the midpoint of the logic swing of buffered signal $A_2$. P-channel transistors 112 and 113 are connected to form a current mirror, and provide the loads for operational amplifier 111. Buffered signal $A_2$ is referenced to $V_{SS}$ and provided at a logic high of about 1.5 volts and a logic low of about 0.9 volts. A circuit similar to input buffer 20 of FIG. 1 (not shown) provides buffered signal $A_2$. In other embodiments, other types of input buffers may supply a buffered signal to level converter 110.

When buffered signal $A_2$ is equal to a logic high, NPN transistor 115 is conductive and NPN transistor 114 is substantially non-conductive. P-channel transistors 112 and 113 are substantially non-conductive. Emitter-follower transistor 122 is substantially non-conductive, and the voltage at node 107 is reduced to about 0.6 volts by cross-coupled half-latch 128. Cross-coupled half-latch 128 is the same as cross-coupled half-latch 75 of FIG. 3, which was discussed above.

When buffered signal $A_2$ is equal to a logic low, NPN transistor 114 is conductive and NPN transistor 115 is substantially non-conductive. P-channel transistors 112 and 113 are conductive, emitter-follower transistor 122 is conductive, and the voltage at node 107 is equal to a logic high voltage approximately equal to $V_{REG}$ minus one $V_{BE}$. A clamping circuit, comprising NPN transistors 117 and 119 and bias voltage $V_{CLAMP}$ prevent NPN transistors 114 and 115 from operating in the saturation region, as described above in the discussion of level converter 60 of FIG. 3. Also, output driver portion 130 is the same as output driver portions 81 and 86 of FIG. 3.

Resistor 118 is sized to help prevent the voltage at the collector of NPN transistor 114 from dropping below about 1.3 volts. This allows P-channel transistor 112 to be reduced in sized, thereby decreasing the junction capacitance of P-channel transistor 112. Reducing the junction capacitance results in an increase in switching speed. Also, emitter-follower transistor 121 may be smaller in size because emitter-follower transistor 121 is not required to drive a load, hence improving the switching speed of level converter 110.

While the invention has been described in the context of a preferred embodiment, it will be apparent to those skilled in the art that the present invention may be modified in numerous ways and may assume many embodiments other than that specifically set out and described above. For example, level converter 60 can be easily adapted to convert from ECL to CMOS logic levels. Also, power supply voltage terminal $V_{DD}$ may be connected to ground and power supply voltage terminal $V_{SS}$ may be supplied with a negative power supply voltage. Accordingly, it is intended by the appended claims to cover all modifications of the invention which fall within the true spirit and scope of the invention.

We claim:

1. A level converter for converting signals operating within a first predetermined voltage level range to a second predetermined voltage level range, the level converter comprising:

a differential amplifier, including first and second resistors and first and second bipolar transistors, for receiving first and second input signals within said first predetermined voltage level range, and in response providing first and second differential signals, said differential amplifier coupled to a first power supply voltage terminal;

a first emitter-follower transistor, coupled to said differential amplifier, for receiving said first differential signal, and in response, providing a third signal within said second predetermined voltage level range;

a second emitter-follower transistor, coupled to said differential amplifier, for receiving said second differential signal, and in response, providing a fourth signal within said second predetermined voltage level range; and cross-coupled half-latch means, coupled to said first and second emitter-follower transistors, for reducing said fourth signal from a high voltage level to a low voltage level within said second predetermined voltage level range in response to a high voltage level being provided by said second emitter-follower transistor, and for reducing said third signal from a high voltage level to a low voltage level within said second predetermined voltage level range in response to a high voltage level being provided by said first emitter-follower transistor; and cross-coupled pull-up means, coupled between said first power supply voltage terminal and a first current electrode of both of said first and second bipolar transistors, for increasing a voltage more rapidly at said first current electrode of said first bipolar transistor in response to a low voltage level being provided by said second emitter-follower transistor, and for increasing a voltage at said first current electrode of said second bipolar transistor in response to a low voltage level being provided by said first emitter-follower transistor.

2. The level converter of claim 1, wherein said cross-coupled pull-up means comprises:

a first P-channel transistor having a first current electrode coupled to said first power supply voltage terminal, a second current electrode coupled to said first current electrode of said second bipolar transistor, and a control electrode coupled to an emitter of said first emitter-follower transistor; and a second P-channel transistor having a first current electrode coupled to said first power supply voltage terminal, a second current electrode coupled to said first current electrode of said first bipolar transistor, and a control electrode coupled to an emitter of said second emitter-follower transistor.

3. The level converter of claim 1, wherein said first power supply voltage terminal is characterized as providing a regulated power supply voltage.

4. The level converter of claim 1, further comprising clamping means, for preventing said first and second bipolar transistors from operating in a saturation operating region.

5. The level converter of claim 1, wherein said first and second resistors are each P-channel transistors.

6. A BICMOS level converter circuit for converting signals operating within a first predetermined voltage level range to a second predetermined voltage level range, the level converter comprising:
  a differential amplifier, including first and second resistors and first and second bipolar transistors, for receiving first and second input signals within said first predetermined voltage level range, and in response providing first and second differential signals, said differential amplifier coupled to a first power supply voltage terminal;
  a first emitter-follower circuit, coupled to said differential amplifier, for receiving said first differential signal, and in response, providing a third signal within said second predetermined voltage level range;
  a second emitter-follower circuit, coupled to said differential amplifier, for receiving said second differential signal, and in response, providing a fourth signal within said second predetermined voltage level range;
  a cross-coupled half-latch, coupled to said first and second emitter-follower circuits, for reducing said fourth signal from a high voltage level to a low voltage level within said second predetermined voltage level range in response to a high voltage level being provided by said second emitter-follower circuit, and for reducing said third signal from a high voltage level to a low voltage level within said second predetermined voltage level range in response to a high voltage level being provided by said first emitter-follower circuit;
  cross-coupled pull-up means, coupled between said first power supply voltage terminal and a first current electrode of said first and second bipolar transistors, for increasing a voltage at said first current electrode of said first bipolar transistor in response to a low voltage level being provided by said second emitter-follower circuit, and for increasing a voltage at said first current electrode of said second bipolar transistor in response to a low voltage level being provided by said first emitter-follower circuit; and
  clamping means, for preventing said first and second bipolar transistors from operating in a saturation operating region.

7. The BICMOS level converter circuit of claim 6, wherein said first emitter-follower circuit comprises a third bipolar transistor, and said second emitter-follower circuit comprises a fourth bipolar transistor.

8. The BICMOS level converter circuit of claim 7, wherein said cross-coupled pull-up means comprises:
  a first P-channel transistor having a first current electrode coupled to said first power supply voltage terminal, a second current electrode coupled to said first current electrode of said second bipolar transistor, and a control electrode coupled to an emitter of said third bipolar transistor; and
  a second P-channel transistor having a first current electrode coupled to said first power supply voltage terminal, a second current electrode coupled to said first current electrode of said first bipolar transistor, and a control electrode coupled to an emitter of said fourth bipolar transistor.

9. The BICMOS level converter circuit of claim 7, wherein said cross-coupled half-latch means comprises:
  a first diode having a first terminal coupled to a second current electrode of said third bipolar transistor, and a second terminal;
  a first N-channel transistor having a first current electrode coupled to said second terminal of said first diode, a control electrode coupled to said second current electrode of said fourth bipolar transistor, and a second current electrode coupled to a second power supply voltage terminal;
  a second diode having a first terminal coupled to a second current electrode of said fourth bipolar transistor, and a second terminal; and
  a second N-channel transistor having a first current electrode coupled to said second terminal of said second diode, a control electrode coupled to said second current electrode of said third bipolar transistor, and a second current electrode coupled to a second power supply voltage terminal.

10. The BICMOS level converter circuit of claim 6, wherein said first power supply voltage terminal is characterized as providing a regulated power supply voltage.

11. The BICMOS level converter circuit of claim 6, wherein said clamping means comprises:
  a fifth bipolar transistor having a first current electrode, a control electrode for receiving a bias voltage, and a second current electrode coupled to said first current electrode of said first bipolar transistor; and
  a sixth bipolar transistor having a first current electrode, a control electrode for receiving a bias voltage, and a second current electrode coupled to said first current electrode of said second bipolar transistor.

12. An ECL to BINMOS level converter, comprising:
  an input buffer for receiving an ECL level logic signal and providing a first and second differential signals of a predetermined voltage level in response thereto;
  differential amplifier means, coupled to a first positive power supply voltage terminal, for receiving said first and second differential signals, and having first and second differential outputs for providing third and fourth differential signals;
  a first emitter-follower transistor having a collector coupled to a second positive power supply voltage terminal, a base coupled to said first differential output, and an emitter;
  a second emitter-follower transistor having a collector coupled to said second positive power supply voltage terminal, a base coupled to said second differential output, and an emitter;
  a first P-channel transistor having a source coupled to said first positive power supply voltage terminal, a gate coupled to said emitter of said first emitter-follower transistor, and a drain coupled to said second differential output;

a second P-channel transistor having a source coupled to said first positive power supply voltage terminal, a gate coupled to said emitter of said second emitter-follower transistor, and a drain coupled to said first differential output;

a first bipolar transistor having a collector and a base coupled to said emitter of said first emitter-follower transistor, and an emitter;

a second bipolar transistor having a collector and a base coupled to said emitter of said second emitter-follower transistor, and an emitter;

a first N-channel transistor having a drain coupled to said emitter of said first bipolar transistor, a gate coupled to said emitter of said second emitter-follower transistor, and a source coupled to a negative power supply voltage terminal;

a second N-channel transistor having a drain coupled to said emitter of said second bipolar transistor, a gate coupled to said emitter of said first emitter-follower transistor, and a source coupled to said negative power supply voltage terminal; and output driver means, coupled to said emitter of said first emitter-follower transistor, for providing a BINMOS level output signal.

13. The ECL to BINMOS level converter of claim 12, further comprising a clamping means comprising:

a third bipolar transistor, having a collector coupled to said second positive power supply voltage terminal, a base for receiving a bias voltage, and an emitter coupled to said first differential output; and a fourth bipolar transistor, having a collector coupled to said second positive power supply voltage terminal, a base for receiving said bias voltage, and an emitter coupled to said second differential output.

14. The ECL to BINMOS level converter of claim 12, wherein said first positive power supply voltage terminal is further characterized as providing a regulated power supply voltage.

* * * * *